(12) United States Patent
Ohnakado et al.

(10) Patent No.: US 6,734,509 B2
(45) Date of Patent: May 11, 2004

(54) SEMICONDUCTOR INTEGRATED CIRCUIT

(75) Inventors: Takahiro Ohnakado, Hyogo (JP); Akihiko Furukawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/274,451

(22) Filed: Oct. 21, 2002

(65) Prior Publication Data

US 2003/0075765 A1 Apr. 24, 2003

(30) Foreign Application Priority Data

Oct. 23, 2001 (JP) ........................................ 2001-324779

(51) Int. Cl.⁷ ............................................... H01L 29/72
(52) U.S. Cl. ........................ 257/393; 257/189; 257/295
(58) Field of Search ................................ 257/189, 295, 257/393

(56) References Cited

U.S. PATENT DOCUMENTS 6,462,360 B1 * 10/2002 Higgins et al. ............. 257/189

FOREIGN PATENT DOCUMENTS

| JP | 8-306811 | 11/1996 |
| JP | 2000-68386 | 3/2000 |

OTHER PUBLICATIONS

Groves, Rob, et al., "High Q Inductors in a SIGe BiCMOS Process Utilizing a Thick Metal Process Add–on Module", IEEE BCTM 9.3, 1999, pp. 149–152.

* cited by examiner

*Primary Examiner*—Edward Wojciechowicz
(74) *Attorney, Agent, or Firm*—Leydig, Voit & Mayer, Ltd.

(57) ABSTRACT

A semiconductor integrated circuit device includes a silicon substrate having a first region and a second region identical in conductivity type to the first region and having a lower dopant concentration than the first region, a second MOS transistor on a main surface of the second region as a radio frequency switch circuit switching on and off input and output of a radio frequency signal, and a first MOS transistor on a main surface of the first region in a radio frequency circuit other than the radio frequency switch circuit. A high performance, highly reliable semiconductor integrated circuit with an RE switch circuit provided on a silicon substrate as a system on a chip.

16 Claims, 10 Drawing Sheets

SEMICONDUCTOR INTEGRATED CIRCUIT

BACKGROUND OF THE INVENTION

1. Field of the Invention

The present invention relates generally to semiconductor integrated circuits and particularly to silicon semiconductor integrated circuits having a radio frequency (RF) circuit processing an RF signal.

2. Description of the Background Art

In recent years, as mobile phones have widely been used and wireless LANs have practically been used, semiconductor integrated circuits that are used in such electronics have been noted and RF semiconductor devices have been noted in particular. To provide electronics with high performance, it is essential that an RF semiconductor device serving as a main component provide high performance have a small size and be produced inexpensively.

Conventionally, group III-V compound semiconductors having high electron mobility, such as GaAs, have been a main stream of materials subtrates used in an RF semiconductor device. Group III-V compound semiconductors, however, are much more expensive than silicon, typically used as a material for substrates of semiconductor devices and have been an obstacle to inexpensively producing RF semiconductor devices.

The recent rapid advance in silicon MOS transistor microfabrication technology has now allowed silicon MOS transistors to have a small gate length less than 0.2 $\mu$m. Such silicon MOS transistors allow significantly improved transconductance Gm and have now achieved characteristics applicable as gigahertz RF semiconductor devices.

If a silicon MOS transistor can be used to fabricate an RF semiconductor device, a significant cost reduction can be achieved and it can also be expected that a baseband portion or any other similar logic circuit portion conventionally fabricated using silicon MOS process techniques is provided in the form of a single chip, and by System On Chip (SOP) a reduction in cost and that in area for mounting can also be achieved. Thus there is a demand for rapidly developing an RF semiconductor device using a silicon substrate and having more satisfactory characteristics.

As has been described above, a silicon RF semiconductor device has RF characteristics having attained a level sufficiently applicable as an RF semiconductor device. However, it has several disadvantages in SOPing with an RF switch circuit switching on/off an input and output of an RF signal (hereinafter an RF signal processing circuit other than the RF switch circuit will be referred to as a "specific RF circuit"). In particular, if it is used in a radio frequency range of no less than the 5 GHz band, the RF switch circuit's insertion loss is disadvantageously increased and SOPing can hardly be implemented.

In RF semiconductor devices that are used in mobile phones, wireless LANs and the like, as aforementioned, an RF switch circuit is a significantly important circuit. As shown in FIG. 18, typically a switch circuit 140 is configured by a transmission and reception switch circuit using a single pole double throw (SPDT) switch 140'. In reception, the switch receives an RF signal from an antenna 141 and transfers the signal to a reception portion's low noise amplifier (an RF low noise amplification circuit) 150. In transmission, the switch receives an RF signal from a power amplifier 150' and transmits the signal to antenna 141.

Fabricating SPDT switch 140' using an MOS transistor 130 allows SOPing with another, specific RF circuit. A possible, simplest configuration of the SPDT switch is shown in FIG. 19 by way of example. Furthermore, FIG. 20 is an equivalent circuit diagram of the FIG. 19 SPDT switch with a transmission side ON and a reception side OFF. In this SPDT switch an insertion loss increases for the following reason:

In FIG. 20, $C_d$ represents an MOS transistor's source/drain junction capacitance. Through source/drain junction capacitance $C_d$ a substrate resistance $R_{si}$ is connected to a circuit. Improving the MOS transistor's ON characteristics entails reducing an ON resistance $R_{ON}$ and a relatively large gate width of approximately 100 $\mu$m to 400 $\mu$m is accordingly used. As such, source/drain junction capacitance $C_d$ would assume a relatively large value. Furthermore, the source/drain junction capacitance $C_d$ impedance $|z|$ is represented by $1/(2\pi \times f \times C_d)$ and it decreases for a gigahertz RF frequency range, since frequency f assumes a large value. Consequently, an RF signal flows to substrate resistance $R_{si}$ and an RF signal to be transmitted by a switch would have a loss in transmission, i.e., an insertion loss is introduced. As such, for an RF range (of no less than the 5 GHz band in particular) an insertion loss is significantly increased and a satisfactory switch circuit can hardly be fabricated.

An SOPed RF silicon semiconductor device needs to employ a substrate formed of silicon providing a small resistance (of approximately 10 m$\Omega$ to 10 $\Omega$) to prevent latch-up. As such, in an RF switch circuit, with a large source/drain junction capacitance $C_d$, as described above, the silicon substrate's resistance $R_{si}$ contributes to a significant loss. As such, SOPing with another specific RF circuit has significantly been difficult.

SUMMARY OF THE INVENTION

The present invention contemplates a semiconductor integrated circuit that can also provide high performance and high reliability when SOPing is employed to provide an RF switch circuit on a silicon substrate to switch on/off an input and output of an RF signal.

In accordance with the present invention a semiconductor integrated circuit includes a silicon substrate and first and second MOS transistors formed on the silicon substrate. The silicon substrate has a first region and a second region identical in conductivity to the first region and having a lower dopant concentration than the first region. The second MOS transistor is formed on a main surface of the second region and configures an RF switch circuit switching on/off an input and output of an RF signal. The first MOS transistor is formed on a main surface of the first region and configures a specific RF circuit other than the RF switch circuit.

Thus the first MOS transistor that is biased can provide a depletion layer larger in width, as seen in the direction of the thickness of the silicon substrate, than the second MOS transistor that is biased can. As such, the second MOS transistor can significantly be smaller in source/drain junction capacitance than the first MOS transistor. As a result, the first MOS transistor can be used to configure the specific RF circuit, which requires small-current-leakage characteristics, and the second MOS transistor can be used to configure the RF switch circuit, which essentially requires reduced source/drain junction capacitance, to provide a semiconductor integrated circuit with the specific RF circuit and the RF switch circuit arranged together on a single silicon substrate and having satisfactory characteristics. Note that they can discretely be fabricated in a conventional MOS process fabrication process simply by using an additional photomask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention in embodiments will be described with reference to the drawings.

First Embodiment

The present invention in a first embodiment provides a silicon semiconductor integrated circuit with an RF switch circuit and another, specific RF circuit processing an RF signal that are SOPed on a single silicon substrate. Furthermore as the specific RF circuit a logic circuit such as a baseband portion may be included.

Configuration

Figure 1:
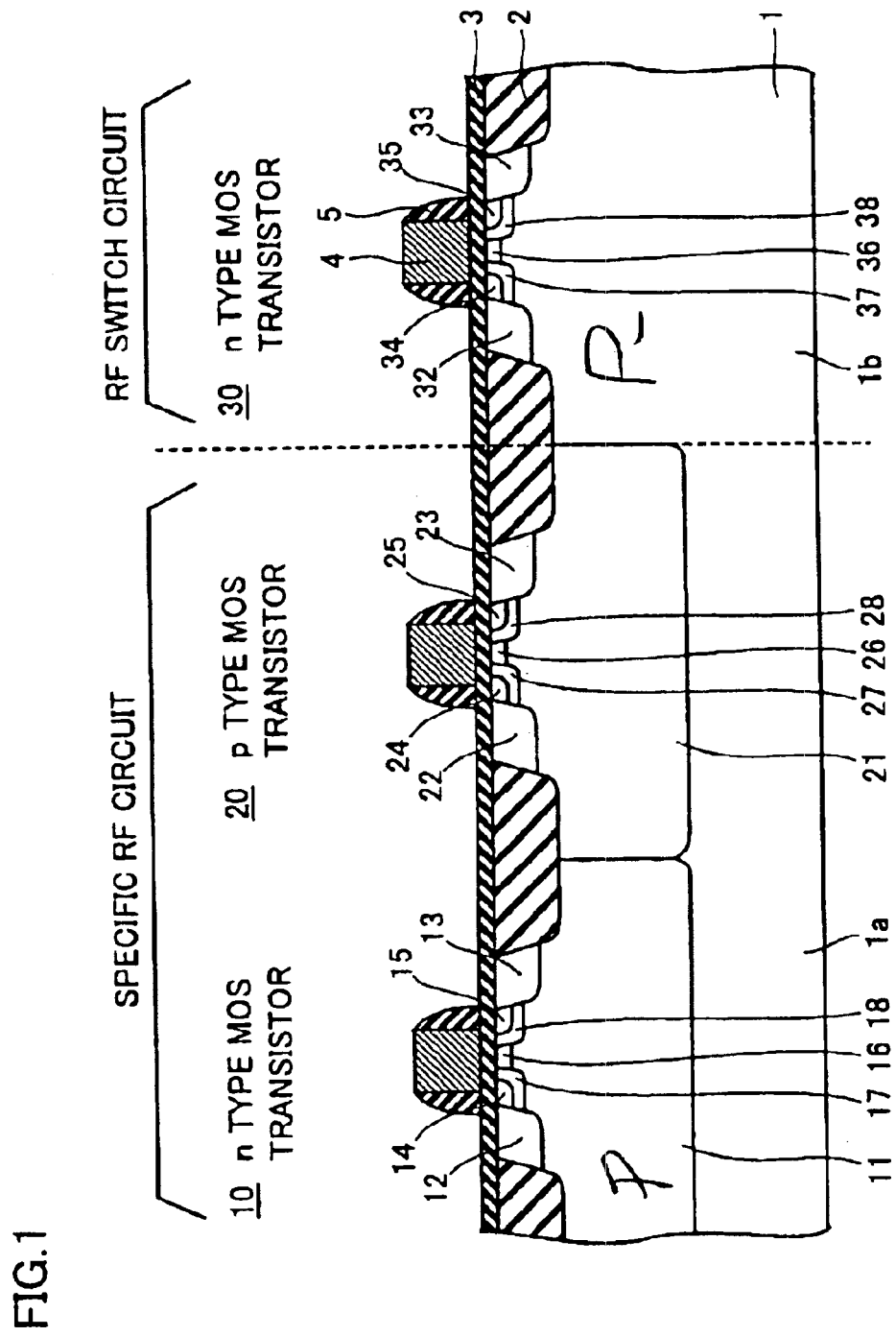
FIG. 1 is a cross section of a silicon semiconductor integrated circuit of a first embodiment of the present invention including an RF switch circuit and another specific RF circuit.

Reference will initially be made to FIG. 1 to describe a configuration of the silicon semiconductor integrated circuit of the present embodiment. The silicon semiconductor integrated circuit in the present embodiment employs an MOS transistor as a semiconductor device used in the specific RF circuit and it also employs an MOS transistor in the RF switch circuit.

Of the above MOS transistors, a p type MOS transistor 20 for the specific RF circuit includes a p type source diffusion layer 22 and a p type drain diffusion layer 23 on a main surface of a silicon substrate 1. Source and drain diffusion layers 22 and 23 include lightly doped drain (LDD) diffusion layers 24 and 25, respectively, adjacent thereto. Furthermore between LDD diffusion layers 24 and 25 a channel doping layer 26 is formed for adjusting a threshold voltage $V_{th}$. Furthermore LDD diffusion layers 24 and 25 are surrounded by n$^+$ type pocket diffusion layers 27 and 28 formed by shallow ion injection. $V_{th}$ adjusting channel doping layer 26 and n$^+$ type pocket diffusion layers 27 and 28 are provided to improve the MOS transistor's basic characteristics, such as ON current characteristics and threshold voltage $V_{th}$, to sufficiently eliminate source-drain current leakage.

Furthermore in a substrate region underlying p type MOS transistor 20 of the specific RF circuit a highly doped n well layer 21 is formed to extend in the direction of the depth of silicon substrate 1 from a pn junction interface corresponding to a bottom plane of source and drain diffusion layers 22 and 23 and also to a boundary between layers 22 and 23 and the substrate region. Furthermore, although not shown in the figure, a plurality of highly doped n type layers such as an n type punchthrough stopper layer, an n type isolation layer and an n type buried layer are formed, as required, in the substrate region underlying the pn junction interface. This highly doped n type layers are essential to currently used MOS transistors for example to prevent latch-up and reduce current leakage.

The specific RF circuit and the RF switch circuit include n type MOS transistors 10 and 30, respectively, having n type source diffusion layers 12 and 32, respectively, and n type drain diffusion layers 13 and 33, respectively on a main surface of silicon substrate 1. Source and drain diffusion layers 12 and 13 are adjacent to LDD diffusion layers 14 and 15, respectively, and source and drain diffusion layers 32 and 33 are adjacent to LDD diffusion layers 34 and 35, respectively. Furthermore between LDD diffusion layers 14 and 15 and between LDD diffusion layers 34 and 35 channel doping layers 16 and 36 are formed, respectively, for adjusting threshold voltage $V_{th}$. Furthermore, LDD diffusion layers 14 and 15, and 34 and 35 are surrounded by p$^+$ type pocket diffusion layers 17 and 18, and 37 and 38, respectively, formed by shallow ion injection.

Figure 2:
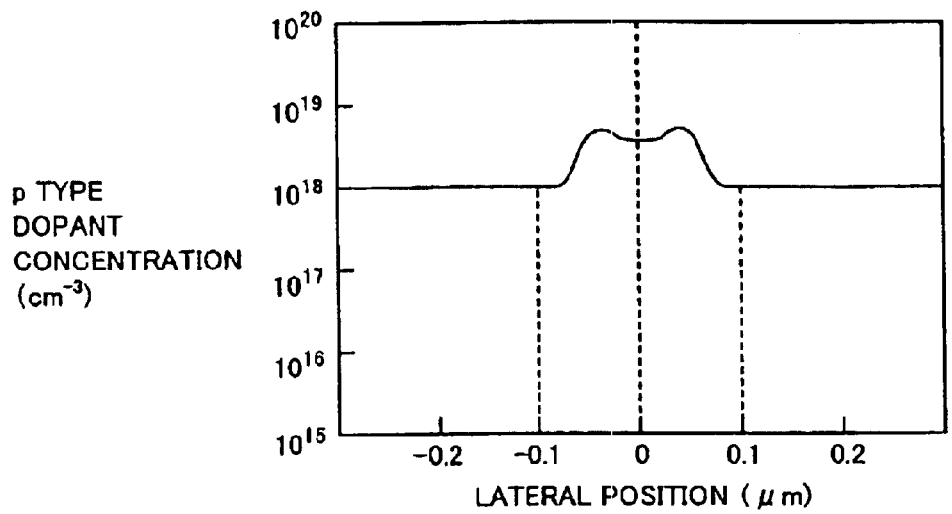
FIG. 2 represents a lateral, one-dimensional dopant concentration profile traversing source and drain diffusion layers of an n type MOS transistor of the RF switch circuit of the silicon semiconductor integrated circuit of the first embodiment.

With reference to FIG. 2, n type MOS transistors 10 and 30, with the aforementioned LDD diffusion layers 14 and 15, and 34 and 35, threshold voltage $V_{th}$ adjusting channel doping layers 16 and 36, and furthermore p$^+$ type pocket diffusion layers 17 and 18, and 37 and 38, have a channel region having an uneven dopant concentration. Furthermore, the channel region's dopant concentration, as seen in a direction parallel to a main surface of silicon substrate 1, increases in a vicinity of a portion of source and drain diffusion layers 12 and 13, and 32 and 33, i.e., LDD diffusion layers 14 and 15, and 34 and 35. $V_{th}$ adjusting channel doping layers 16 and 36, and p+ type pocket diffusion layers 17 and 18, and 37 and 38 enhance the MOS transistors' basic characteristics (such as ON current characteristics and threshold voltage $V_{th}$) and sufficiently eliminate source-drain current leakage. Note that p type MOS transistor 20 also has a channel region having a similar, uneven dopant concentration profile, although different in conductivity.

Furthermore in a substrate region 1a underlying p type MOS transistor 10 of the specific RF circuit a highly doped p well layer 11 is formed to extend in the direction of the depth of silicon substrate 1 from a pn junction interface corresponding to a bottom plane of source and drain diffusion layers 12 and 13 and also to a boundary between layers 12 and 13 and substrate region 1a. Furthermore, although not shown in the figure, a plurality of highly doped p type layers such as a p type punchthrough stopper layer and a p type isolation layer are formed, as required, in substrate region 1a underlying the pn junction interface. These highly doped p type layers are essential to currently used MOS transistors for example to prevent latch-up and reduce current leakage.

In contrast, n type MOS transistor 30 of the RF switch circuit overlies a substrate region 1b free of any highly doped, p type well layer extending from a pn junction interface in the direction of the depth of silicon substrate 1. Furthermore, a p type isolation layer, a p type punchthrough stopper layer and any other similar, highly doped p type layer are also absent. As such, substrate region 1b has the initial dopant concentration of silicon substrate 1. As such, the dopant concentration of substrate region 1b immediately underlying an interface between source and drain diffusion layers 32 and 33 and substrate region 1b of n type MOS transistor 30 of the RF switch circuit, is lower than that of substrate region 11 immediately underlying an interface between source and drain diffusion layers 12 and 13 and substrate region 1a of n type MOS transistor 10 of the specific RF circuit.

Fabrication

Figure 3:
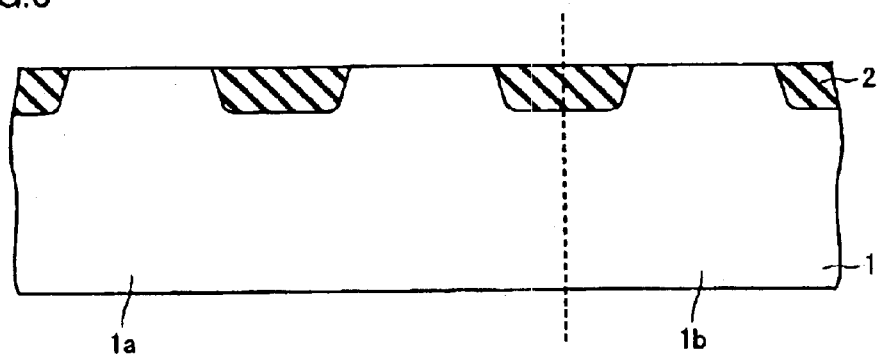
FIGS. 3, 4, 5, 6, 7, and 8 show a process for fabricating the silicon semiconductor integrated circuit of the first embodiment.
Figure 4:
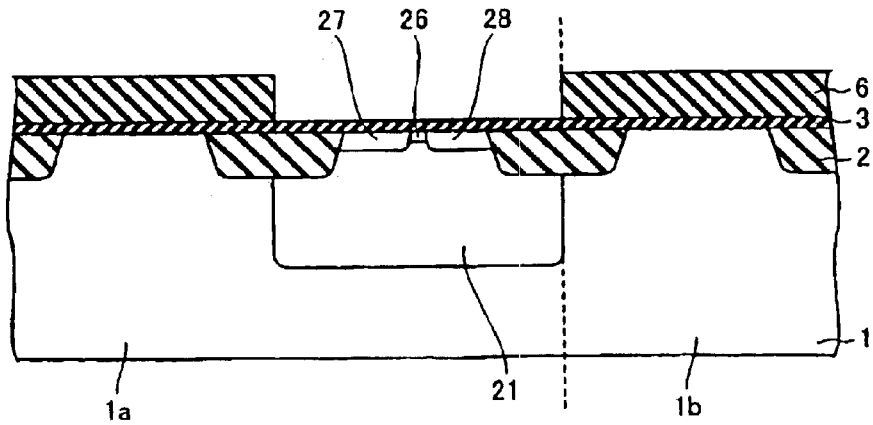
Figure 5:
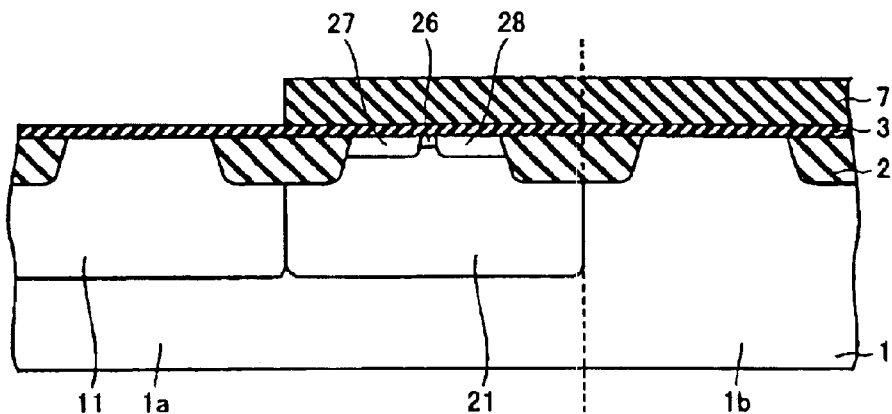
Figure 6:
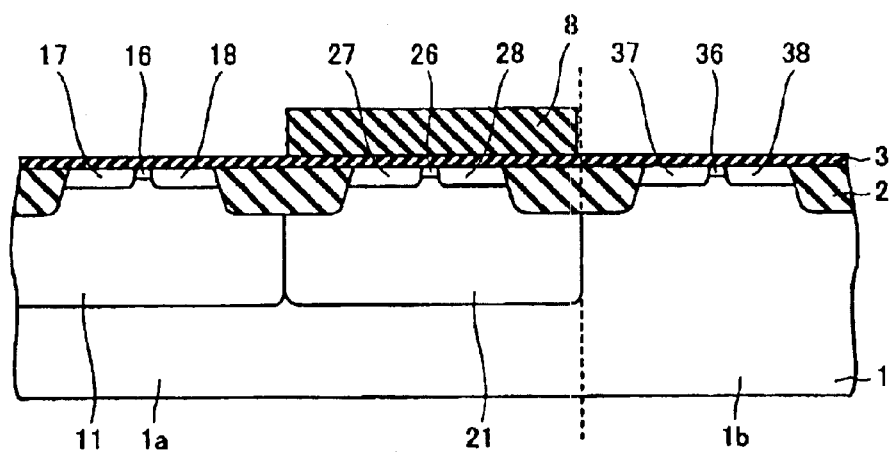
Figure 7:
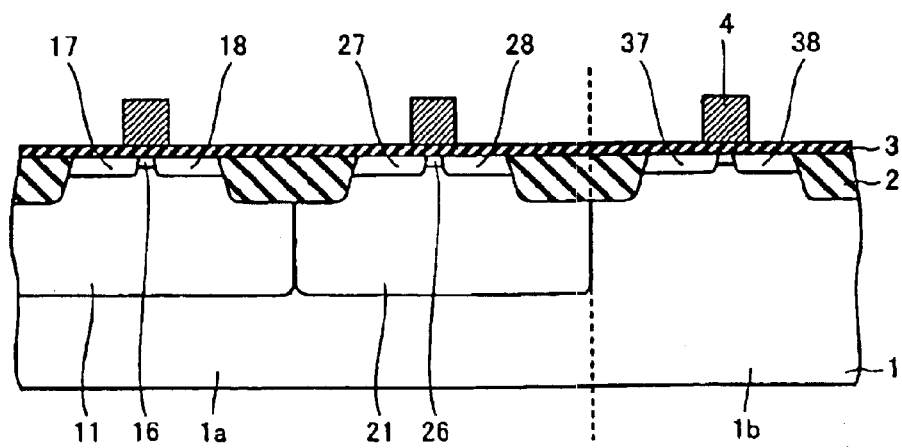
Figure 8:
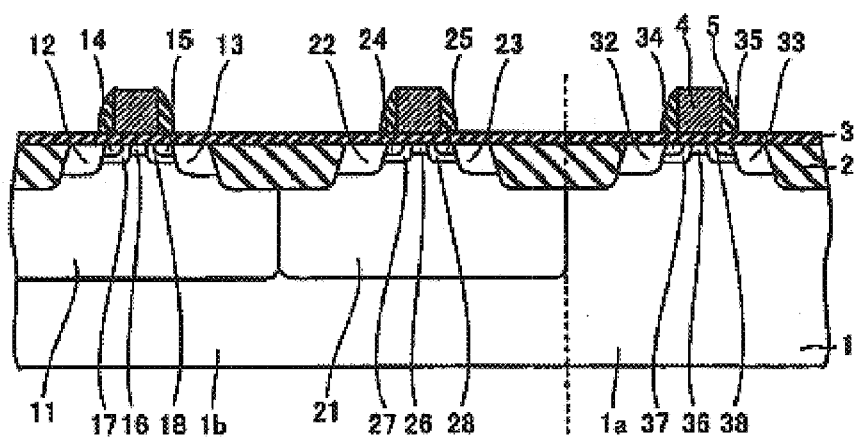

Reference will now be made to FIGS. 3–8 to describe a process for fabricating the silicon semiconductor integrated circuit of the present embodiment. The silicon semiconductor integrated circuit in the present embodiment is fabricated in accordance with a basic MOS transistor process flow. More specifically, as shown in FIG. 3, silicon substrate 1 initially has a main surface provided with an element isolation film 2. Then, as shown in FIG. 4, ion injection is provided for forming p type MOS transistor 20. Then, as shown in FIGS. 5–7, ion injection is provided for forming n type MOS transistors 10 and 30. Furthermore, as shown in FIG. 8, a gate electrode 4 has a side wall provided with a sidewall 5 to complete a semiconductor integrated circuit configured as shown in FIG. 1.

Note, however, that to fabricate the semiconductor integrated circuit of the present embodiment, it is necessary to use an additional photomask to selectively, differently configure a substrate region underlying the n type MOS transistor of the specific RF circuit and that underlying the n type MOS transistor of the RF switch circuit. More specifically, n type MOS transistor 30 of the RF switch circuit overlies substrate region 1b free of any highly doped, p type layer. To achieve this, in forming a plurality of highly doped, p type layers of n type MOS transistor 10 of the specific RF circuit such as p well layer 11, a p type punchthrough stopper layer and a p type isolation layer a region of silicon substrate 1 that is to be served for n type MOS transistor 30 of the RF switch circuit is covered with photoresist 7 (see FIG. 5). A highly doped, p type layer is thus formed selectively only under n type MOS transistor 10 of the specific RF circuit, while the layer is not formed under n type MOS transistor 30 of the RF switch circuit.

Result of Simulation

Figure 9:
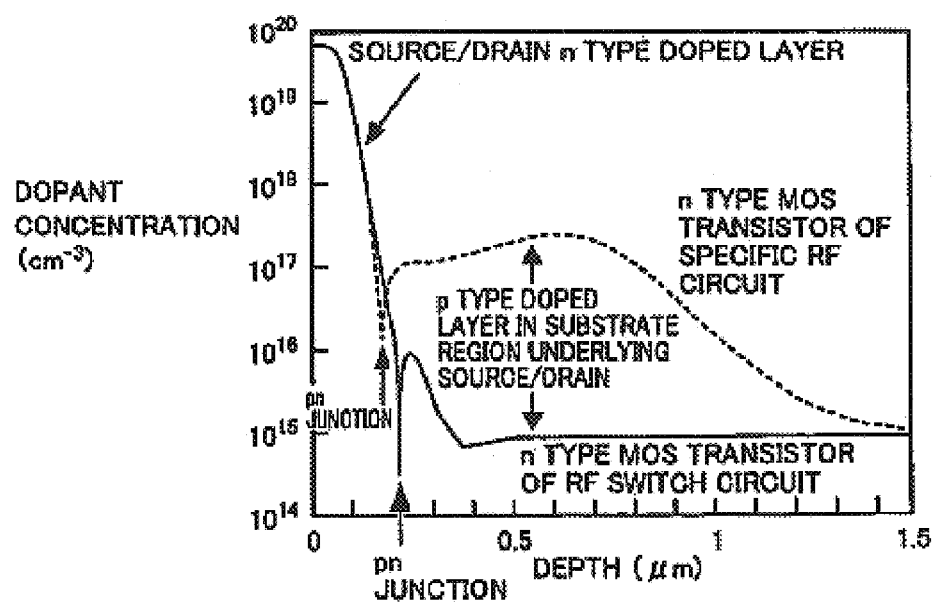
FIG. 9 represents a result of a simulation of a longitudinal, one-dimensional dopant concentration profile traversing the source or drain diffusion layer of the n type MOS transistor of the RF switch circuit or that of an n type MOS transistor of the specific RF circuit in the silicon semiconductor integrated circuit of the first embodiment.
Figure 10:
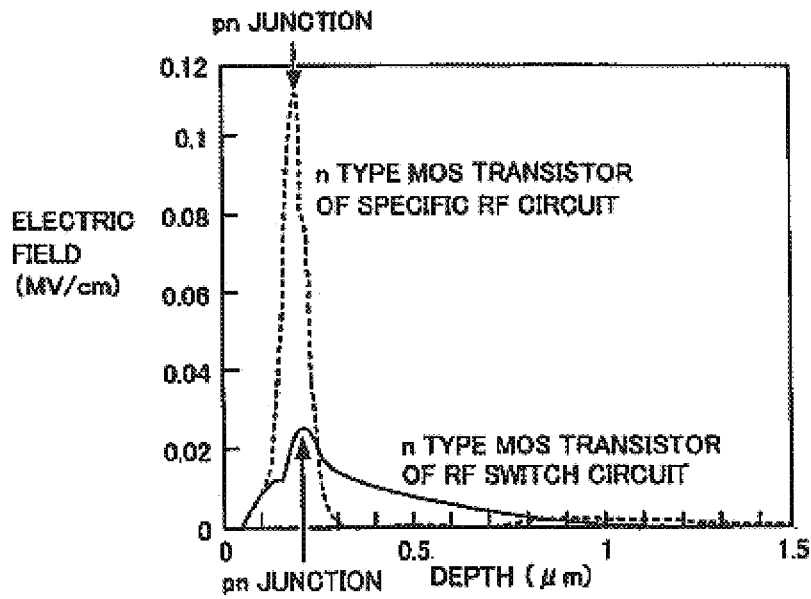
FIG. 10 represents a result of a simulation of a profile of an electric field in a silicon substrate of the silicon semiconductor integrated circuit of the first embodiment that is obtained when the RF switch circuit and the specific RF circuit have their n type MOS transistors biased.

Reference will now be made to FIGS. 9 and 10 to describe a result of a simulation of electrical characteristics of the silicon semiconductor integrated circuit configured as described above. As has been described above, the n type MOS transistor of the RF switch circuit overlies a substrate region free of any highly doped, p type layer, and, as is apparent from FIG. 9, for the n type MOS transistor of the RF switch circuit a p type dopant concentration immediately under a pn junction interface is significantly smaller than for the n type MOS transistor of the specific RF circuit. More specifically, the n type MOS transistor of the specific RF circuit overlies a p type punchthrough stopper layer, a p type isolation layer, a p well layer or the like and under the pn junction interface a dopant concentration of no less than $10^{17}$ cm$^{-3}$ is provided, whereas for the n type MOS transistor of the RF switch circuit a dopant concentration of approximately $10^{15}$ cm$^{-3}$ is provided. This presumably contributes to a larger width, as seen in the direction of the depth of the silicon substrate, of a depletion layer introduced at the pn junction of the n type MOS transistor of the RF switch circuit that is biased than the n type MOS transistor of the specific RF circuit that is biased.

Furthermore, in FIG. 10, as a region having a high electric field may be considered a region of a depletion layer, presumably for the n type MOS transistor of the specific RF circuit a depletion layer in the vicinity of the pn junction interface would be introduced with a significantly small width, whereas for the n type MOS transistor of the RF switch circuit a depletion layer would extend much deeper than the pn junction interface. More specifically, in a semiconductor integrated circuit designed to have a dopant concentration profile as shown in FIG. 9, presumably for the n type MOS transistor of the specific RF circuit a depletion layer would extend only to a depth of approximately 0.1 μm as measured from the pn junction interface, whereas for the n type MOS transistor of the RF switch circuit a depletion layer would extend as deep as approximately 1 μm.

Function and Effect

A silicon semiconductor integrated circuit configured as described above can provide a larger width of a depletion layer extending downward from a pn junction of a MOS transistor of an RF switch circuit that is biased than an n type MOS transistor of another, specific RF circuit that is biased. As such, the former transistor's source/drain junction capacitance $C_d$ can significantly be reduced and accordingly also in an RF range its impedance can sufficiently be increased. This can eliminate a loss of an RF signal that is attributed to a small source/drain junction capacitance $C_d$ of the MOS transistor of the RF switch circuit. An RF semiconductor device with a satisfactory switch function can thus be provided.

Furthermore, as a p type dopant concentration immediately under a pn junction interface of the source and drain is reduced, a resistance $R_{si}$ of a silicon substrate in a grounding path connected to capacitance $C_d$ is also increased and an impedance corresponding to $C_d$ and $R_{si}$ together serving as a grounding path that are added together is increased, and a loss of an RF signal in the MOS transistor of the RF switch circuit is further reduced. A high-performance, RF silicon semiconductor device that has not conventionally been implemented for an RF range such as no less than 5 GHz, can thus be provided.

Note that providing an uneven, lateral, one-dimension dopant concentration laterally traversing source and drain diffusion layers of the n type MOS transistor of the RF switch circuit to form an effectively heavily doped, p type region in a portion laterally adjacent to a pn junction provided by a p$^+$ pocket diffusion layer, ensures preventing a depletion layer from laterally extending and also preventing current leakage attributed to puncthrough.

Prototype

Figure 11:
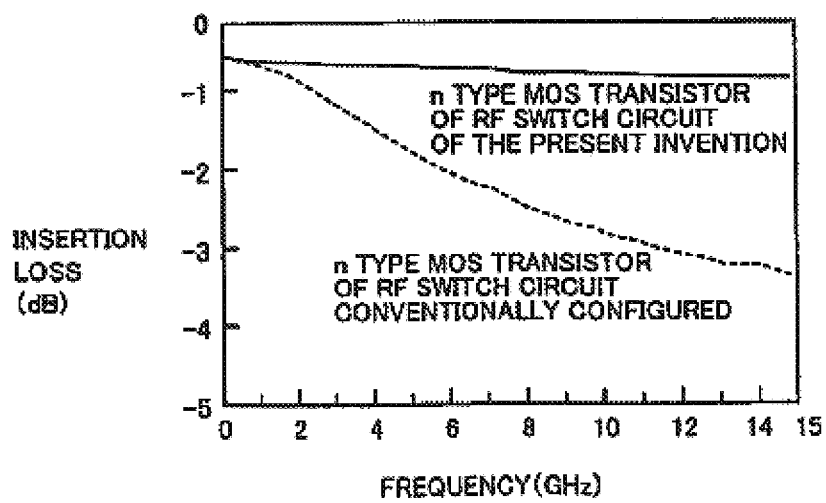
FIG. 11 represents a result of an estimation of discrete source/drain passage characteristics of an MOS transistor of the RF switch circuit in the silicon semiconductor integrated circuit of the first embodiment by S parameter RF characteristics estimation.
Figure 12:
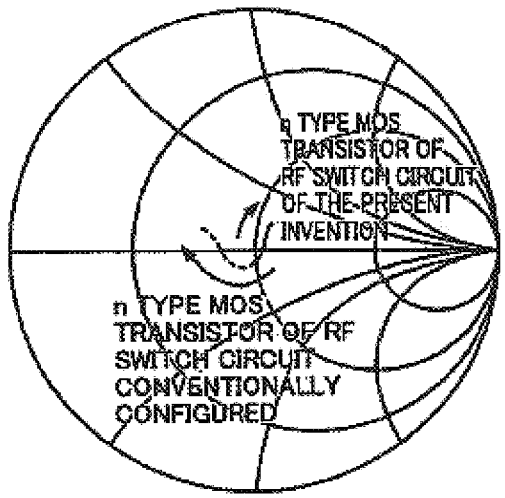
FIG. 12 is a Smith chart of S parameter characteristic S11 of the MOS transistor of the RF switch circuit in the silicon semiconductor integrated circuit of the first embodiment.

A prototype device was fabricated and had its electrical characteristics measured, as represented in FIGS. 11 and 12. FIG. 11 represents a result of an estimation of a discrete, n type MOS transistor's source and drain passage characteristics by S parameter RF characteristics estimation. Note that FIG. 11 also represents a result of a measurement of an n type MOS transistor of an RF switch circuit conventionally configured for reference. As shown in FIG. 11, it can be understood that the n type MOS transistor of the RF switch circuit conventionally configured provides a significantly increased insertion loss for an RF range, whereas that of the RF switch circuit in accordance with the present invention provides a hardly increased insertion loss for the RF range.

FIG. 12 represents S parameter characteristics S11 of the n type MOS transistor of the RF switch circuit as conventional and S parameter characteristics S11 of the n type MOS transistor of the RF switch circuit in accordance with the present invention, as represented in a Smith chart. It can be understood that the n type MOS transistor of the RF switch circuit as conventional provides an arc moving on the chart, starting at the chart's center (50 Ω) and proceeding round in a right downward direction as frequency increases. This indicates that a large source/drain junction capacitance component exists. In contrast, the n type MOS transistor of the RF switch circuit in the present invention does not provide a movement in an arc starting at the chart's center (50 Ω) and proceeding round in the right downward direction. It hardly provides a movement away from the chart's center as frequency increases. That is, it can be understood that junction capacitance is significantly reduced.

Figure 13:
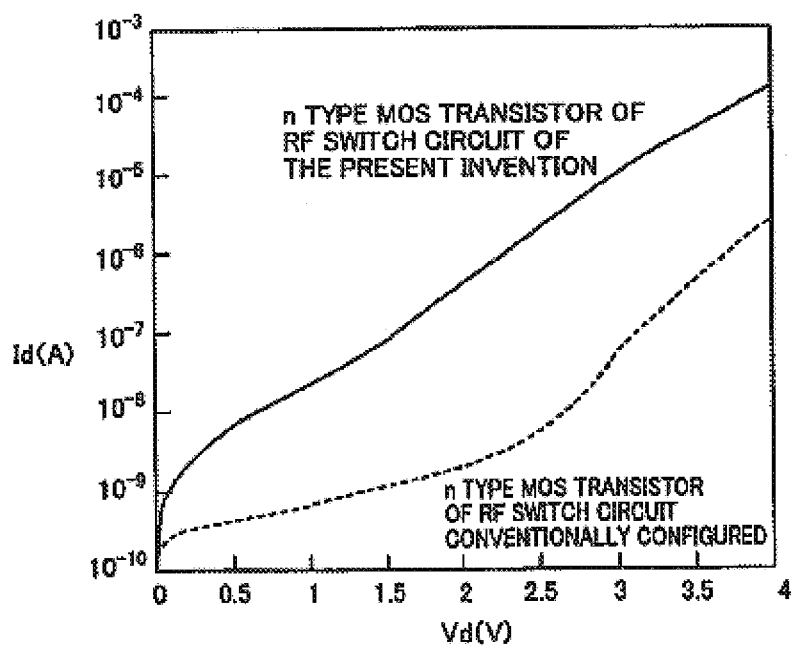
FIG. 13 represents a result of a measurement of a breakdown voltage between source and drain diffusion layers of the MOS transistor of the RF switch circuit in the silicon semiconductor integrated circuit of the first embodiment.

It can thus be understood that the n type MOS transistor of the RF switch circuit in the present invention can exhibit significantly satisfactory RF characteristics. However, its source and drain diffusion layer's bottom surface or a pn junction interface overlies a low p type dopant concentration, and punchthrough characteristics between the source and drain diffusion layers of the MOS transistor may be impaired. FIG. 13 represents a result of a measurement of breakdown voltage between source-drain diffusion layers of the n type MOS transistor of the RF switch circuit of the present embodiment. As can be apparent from the figure, the configuration in the present embodiment provides worse breakdown voltage characteristics than a conventional configuration. More specifically, for a most important power supply voltage (of 1.8 V for this MOS transistor) a current leakage in a device used as a switch and having a gate width of approximately 200 μm has a maximal value of approximately 300 nA, which is no less than 100 times a value (of approximately 2 nA at its maximum) of an MOS transistor of another, specific RF circuit.

For typical logic circuits, an MOS transistor with such a large current leakage cannot be used, since a logic circuit uses a large number of MOS transistors in total, and in total an enormous current would be consumed and reduced power consumption cannot be achieved. An RF switch circuit, as will be described hereinafter, employs as few as two or four devices having a gate width of approximately 200 μm, and a maximal current leakage of 200 nA per MOS transistor is sufficiently acceptable. As such, forming an RF switch circuit of the MOS transistor structured as above, as described in the present embodiment, is not disadvantageous. On the contrary, it can be understood that an effect obtained therefrom is more enormous.

Second Embodiment

Figure 14:
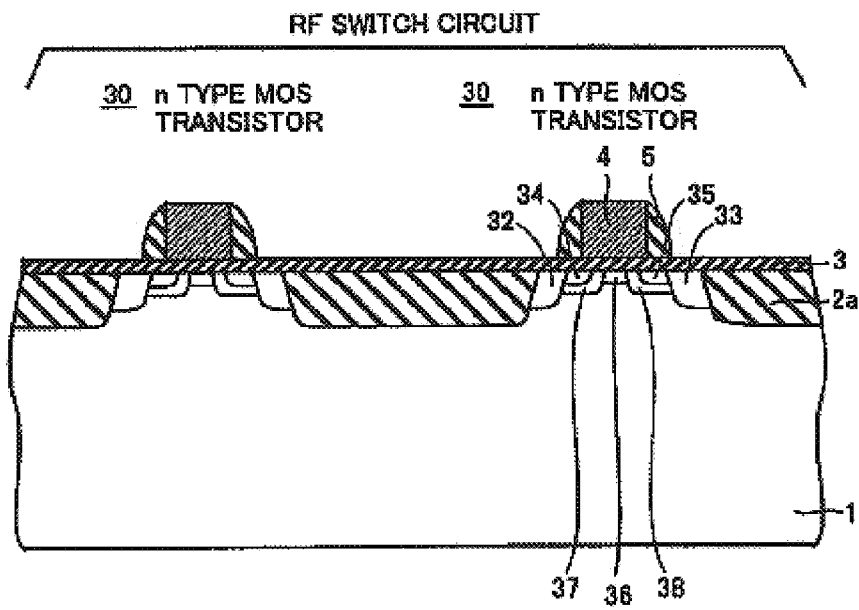
FIG. 14 is a cross section of an RF switch circuit of a silicon semiconductor integrated circuit of a second embodiment of the present invention.

Reference will now be made to FIG. 14 to describe a second embodiment of the present invention. In the present embodiment a semiconductor integrated circuit is configured similarly as described in the first embodiment, although an isolation film 2a adjacent to an active region of n type MOS transistor 30 of an RF switch circuit has a width larger than a minimal design rule (a design rule applied in another, specific RF circuit). This can prevent an isolation film from having a reduced device isolating capability attributed to absence of ion injection for isolation and hence prevent current leakage between adjacent devices from increasing. A circuit using an n type MOS transistor free of ion injection for isolation, as assumed in the present invention, includes an RF switch circuit. The circuit employs no more than several MOS transistors. As such, if an isolating oxide film is increased in width, it does not result in a significantly increased chip area or affect the cost.

Third Embodiment

Figure 15:
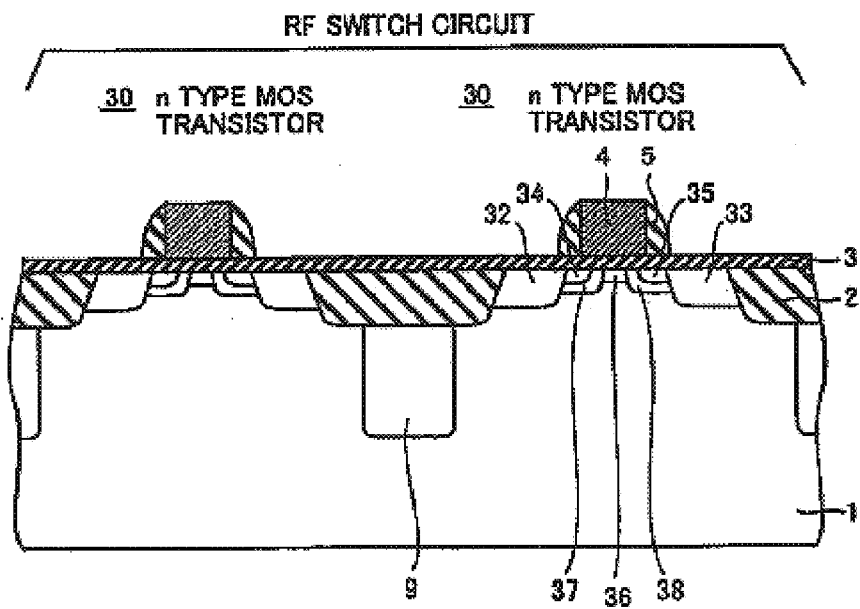
FIG. 15 is a cross section of an RF switch circuit of a silicon semiconductor integrated circuit of a third embodiment of the present invention.

Reference will now be made to FIG. 15 to describe a third embodiment of the present invention. In the present embodiment a semiconductor integrated circuit is configured similarly as described in the first embodiment, although isolation film 2 adjacent to an active region of n type MOS transistor 30 of an RF switch circuit overlies a low doped diffusion layer 9. Thus, the dopant concentration under isolation film 2 adjacent to n type MOS transistor 30 of the RF switch circuit is lower than that under an isolation film adjacent to an active region of an n type MOS transistor of another, specific RF circuit. This can prevent an isolation film from having a reduced device isolating capability attributed to absence of ion injection for isolation in a substrate region, i.e., prevent current leakage between adjacent devices from increasing. Furthermore, the present embodiment allows a chip area to be smaller than the second embodiment does.

Exemplary Application

Figure 16:
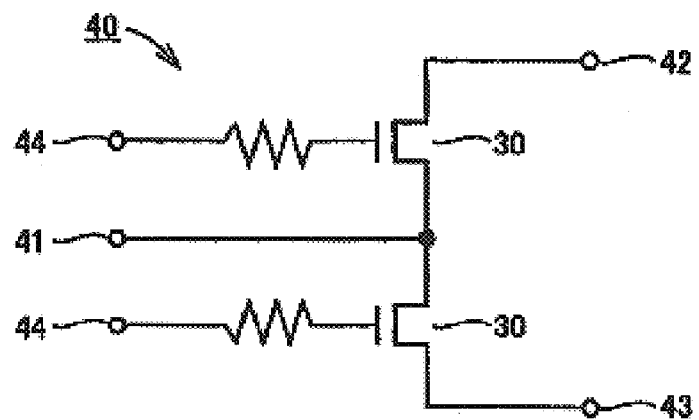
FIG. 16 is a circuit diagram showing one example of a configuration of an RF switch circuit in an exemplary application of the present invention.

In the present exemplary application the MOS transistor of the RF switch circuit as described in any of the first to third embodiments is used to fabricate an SPDT switch as shown in FIG. 16. N type MOS transistor 30 that is used preferably has a gate width of approximately 10 μm to 1 mm and desirably has a gate length in accordance with a minimal design rule to reduce ON resistance $R_{on}$. Forming each device's connection line and each terminal's connection line of a transmission line exhibiting a 50 Ω characteristics impedance for an operating frequency, allows more preferable characteristics.

As such, a p type dopant concentration under a pn junction of source/drain of the n type MOS transistor forming the RF switch circuit, is reduced. A pn junction depletion layer significantly extends and a source/drain junction capacitance significantly decreases. This can significantly reduce a loss of an RF signal passing through the source/drain junction capacitance of the transistor of the RF switch circuit that is attributed to the silicon substrate's resistance and significantly reduce insertion loss, one of the most important RF characteristics of the RF switch circuit.

Figure 17:
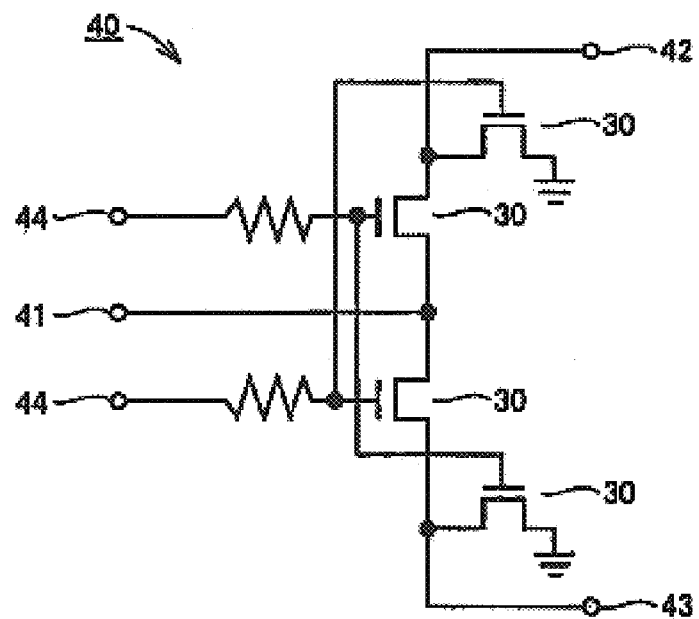
FIG. 17 shows another example of the configuration of the RF switch circuit in the exemplary application of the present invention.
Figure 18:
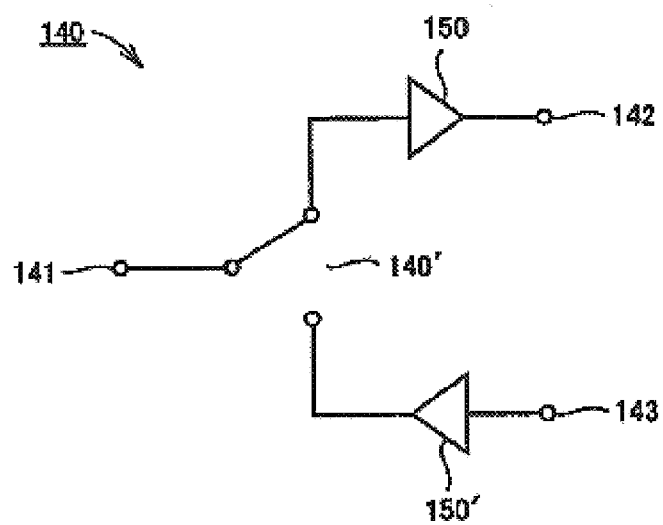
FIG. 18 shows a circuit configuration of an SPDT switch.
Figure 19:
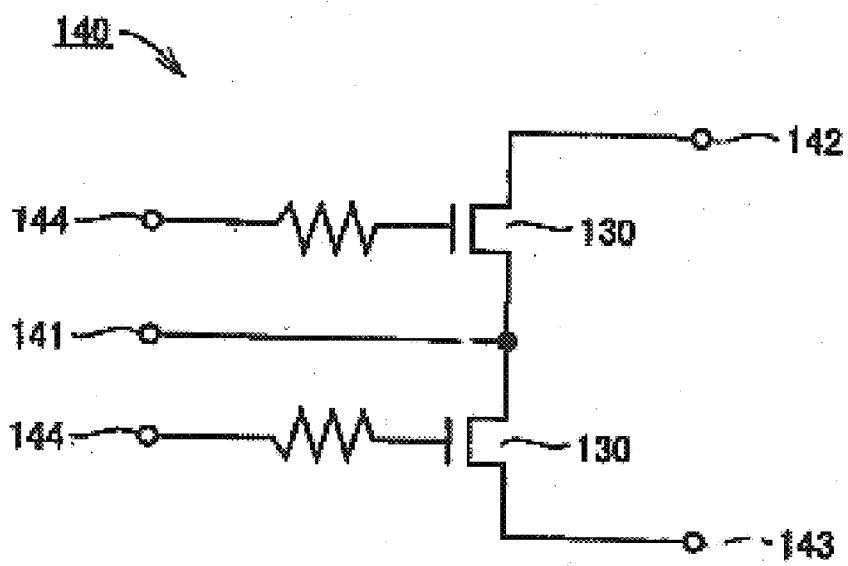
FIG. 19 is a circuit diagram of an SPDT switch using an MOS transistor to configure the circuit.
Figure 20:
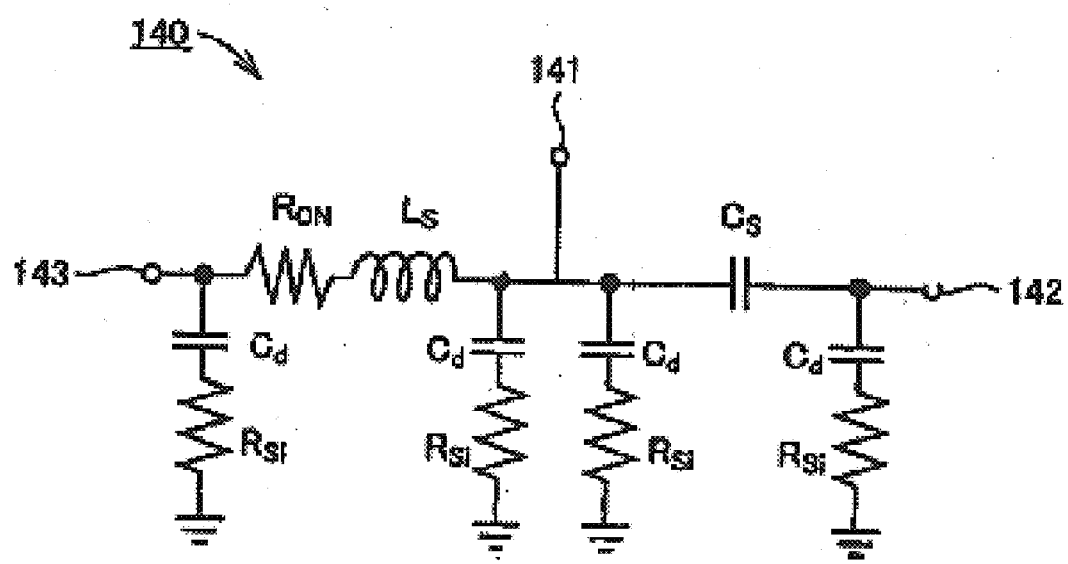
FIG. 20 is an equivalent circuit diagram of the SPDT switch shown in FIG. 19.

Furthermore the MOS transistor of the RF switch circuit as described in any of the first to third embodiments is used to fabricate an SPDT switch as shown in FIG. 17. N type MOS transistor 30 that is used preferably has a gate width of approximately 10 μm to 1 mm and desirably has a gate length in accordance with a minimal design rule to reduce ON resistance $R_{on}$, as described above. Forming each device's connection line and each terminal's connection line of a transmission line exhibiting a 50 Ω characteristics impedance for an operating frequency, allows more preferable characteristics.

As such, a p type dopant concentration under a pn junction of source/drain of the n type MOS transistor forming the RF switch circuit, is reduced. A pn junction depletion layer significantly extends and a source/drain junction capacitance significantly decreases. This can significantly reduce a loss of an RF signal passing through the source/drain junction capacitance of the transistor of the RF switch circuit that is attributed to the silicon substrate's resistance and significantly reduce insertion loss, one of the most important RF characteristics of the RF switch circuit.

Essentially, a series-parallel SPDT switch having an effect improving isolation characteristics is preferably used as a switch circuit. In effect, however, it has been inapplicable, since series-parallel type has conventionally used a larger number of MOS transistors than series type and further increased an increased insertion loss attributed to a source/drain junction capacitance. The present invention can eliminate the increased insertion loss attributed to a source/drain junction capacitance. Accordingly, a series-parallel SPDT switch allowing isolation characteristics to be improved can be used and an SPDT switch having satisfactory RF characteristics can be provided.

In the above description an RF switch circuit has employed an MOS transistor overlying a substrate region free of injection for isolation to have a low concentration. However, it is not limited thereto. The present invention lies in providing a lower dopant concentration in a substrate region of an MOS transistor of an RF switch circuit than in an MOS transistor of another, specific RF circuit, and it is not limited to any particular level of concentration. As such, for example, the MOS transistor of the RF switch circuit may have its well layer, isolation layer, punchthrough stopper layer and the like formed with a smaller dosage than the MOS transistor of the specific RF circuit to achieve a reduced concentration of a substrate region of the MOS transistor of the RF switch circuit.

Furthermore, while in the first embodiment a gate oxide film of the MOS transistor of the specific RF circuit and that of the MOS transistor of the RF switch circuit have simultaneously been formed by way of example, they may be provided separately. More specifically, these gate oxide films may be different in thickness. Desirably, however, they are simultaneously provided to simplify the fabrication process.

Furthermore, desirably, the MOS transistor of the specific RF circuit and that of the RF switch circuit have their respective gates with their respective lengths each set to be a dimension in accordance with a minimal design rule to allow the MOS transistors to have the most excellent gate characteristics.

Note that in general, semiconductor integrated circuits of this type often employ a p type silicon substrate and the RF switch circuits often employ an n type MOS transistor. Partially, however, a p type MOS transistor can be used and the present invention is also applicable thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a silicon substrate having
      a first region and
      a second region identical in conductivity type to said first region and having a lower dopant concentration than said first region;
   a second MOS transistor on a main surface of said second region as a radio frequency switch circuit switching on and off input and output of a radio frequency signal; and
   a first MOS transistor on a main surface of said first region in a radio frequency circuit distinct from said radio frequency switch circuit.

2. The semiconductor integrated circuit according to claim 1, wherein dopant concentration of said second region, adjacent an interface of a source/drain region of said second MOS transistor and said second region, is lower than dopant concentration of said first region adjacent an interface of a source/drain region of said first MOS transistor and said first region.

3. The semiconductor integrated circuit according to claim 1, wherein
   said second MOS transistor has source and drain regions and a channel region for conducting a current flow between said source and drain regions, and
   viewed in a direction parallel to the main surface of said silicon substrate, a portion of said channel region adjacent to an interface of said source and drain regions and said channel region has a higher dopant concentration than a central portion of said channel region.

4. The semiconductor integrated circuit according to claim 1, including
   at least two of said second MOS transistors in said second region of said silicon substrate,
   a second device isolating region in said second region of said semiconductor substrate, between said two second MOS transistors,
   a doped region extending into said silicon substrate from said second device isolation region, and
   a first device isolation region in said silicon substrate adjacent said first region, wherein dopant concentration in said second region in said silicon substrate at an interface between said second region and said second device isolating region and deeper in said silicon substrate than said second device isolation region is lower than dopant concentration in said silicon substrate at an interface between said silicon substrate and said first device isolating region and deeper in said silicon substrate than said first isolation region.

5. The semiconductor integrated circuit according to claim 1, wherein said silicon substrate has a rear surface opposite the main surface and said second region has a dopant concentration which has a maximum at an interface of said second region and source and drain regions of said second MOS transistor, and which monotonically decreases in said silicon substrate in a direction towards the back surface of said silicon substrate.

6. The semiconductor integrated circuit according to claim 1, wherein said first MOS transistor and said second MOS transistor have respective gates equal in length.

7. The semiconductor integrated circuit according to claim 1, wherein said first MOS transistor and said second MOS transistor have respective gate oxide films equal in thickness.

8. The semiconductor integrated circuit according to claim 1, wherein said radio frequency switch circuit is a single pole double throw transmission/reception switch.

9. A semiconductor integrated circuit including a radio frequency circuit including a radio frequency switch circuit switching on and off an input and output of a radio frequency signal and a radio frequency signal processing circuit processing said radio frequency signal, wherein:

said radio frequency signal processing circuit includes a first MOS transistor located in a silicon substrate of a first conductivity type, at a first region of the first conductivity type, having a first dopant concentration, extending from a main surface of said silicon substrate, in a region, in a depth direction of said silicon substrate; and said radio frequency switch circuit includes a second MOS transistor located in said silicon substrate, at a second region of the first conductivity type, having a second dopant concentration, extending from said main surface of said silicon substrate, in a region, in the depth direction of said silicon substrate, the second dopant concentration being lower than the first dopant concentration.

10. The semiconductor integrated circuit according to claim 9, wherein dopant concentration of said second region, adjacent an interface of a source/drain region of said second MOS transistor and said second region, is lower than dopant concentration of said first region adjacent an interface of a source/drain region of said first MOS transistor and said first region.

11. The semiconductor integrated circuit according to claim 9, wherein said second MOS transistor has source and drain regions and a channel region for conducting a current flow between said source and drain regions, and viewed in a direction parallel to the main surface of said silicon substrate, a portion of said channel region adjacent to an interface of said source and drain regions and said channel region has a higher dopant concentration than a central portion of said channel region.

12. The semiconductor integrated circuit according to claim 9, including at least two of said second MOS transistors in said second region of said silicon substrate, a second device isolating region in said second region of said semiconductor substrate, between said two second MOS transistors, a doped region extending into said silicon substrate from said second device isolation region, and a first device isolation region in said silicon substrate adjacent said first region, wherein dopant concentration in said second region in said silicon substrate at an interface between said second region and said second device isolating region and deeper in said silicon substrate than said second device isolation region is lower than dopant concentration in said silicon substrate at an interface between said silicon substrate and said first device isolating region and deeper in said silicon substrate than said first isolation region.

13. The semiconductor integrated circuit according to claim 9, wherein said silicon substrate has a rear surface opposite the main surface and said second region has a dopant concentration which has a maximum at an interface of said second region and source and drain regions of said second MOS transistor, and which monotonically decreases in said silicon substrate in a direction towards the back surface of said silicon substrate.

14. The semiconductor integrated circuit according to claim 9, wherein said first MOS transistor and said second MOS transistor have respective gates equal in length.

15. The semiconductor integrated circuit according to claim 9, wherein said first MOS transistor and said second MOS transistor have respective gate oxide films equal in thickness.

16. The semiconductor integrated circuit according to claim 9, wherein said radio frequency switch circuit is a single pole double throw transmission/reception switch.

* * * * *